US006498069B1

(12) United States Patent
Grivna

(10) Patent No.: US 6,498,069 B1
(45) Date of Patent: Dec. 24, 2002

(54) SEMICONDUCTOR DEVICE AND METHOD OF INTEGRATING TRENCH STRUCTURES

(75) Inventor: Gordon Grivna, Mesa, AZ (US)

(73) Assignee: Semiconductor Components Industries LLC, Phoenix, AZ (US)

( * ) Notice: Subject to any disclaimer, the term of this patent is extended or adjusted under 35 U.S.C. 154(b) by 0 days.

(21) Appl. No.: 09/977,935

(22) Filed: Oct. 17, 2001

(51) Int. Cl.$^7$ .............................................. H01L 21/20
(52) U.S. Cl. ........................ 438/386; 438/422; 438/424
(58) Field of Search ................................. 438/411, 422, 438/619, 386, 424

(56) References Cited

U.S. PATENT DOCUMENTS

| 4,169,000 | A | * | 9/1979 | Riseman ..................... 438/422 |
| 5,391,236 | A | * | 2/1995 | Krut et al. .................. 136/249 |
| 5,516,720 | A | * | 5/1996 | Lur et al. ................... 438/422 |
| 5,926,721 | A | * | 7/1999 | Hong et al. ................. 438/413 |
| 5,972,758 | A | * | 10/1999 | Liang ........................ 438/294 |
| 6,251,734 | B1 | | 6/2001 | Grivna et al. ............... 437/296 |
| 6,307,247 | B1 | | 10/2001 | Davies ....................... 257/522 |

FOREIGN PATENT DOCUMENTS

JP            11-87500     *   3/1999   ......... H01L/21/768

* cited by examiner

*Primary Examiner*—Olik Chaudhuri
*Assistant Examiner*—David S Blum
(74) *Attorney, Agent, or Firm*—James J. Stipanuk

(57) ABSTRACT

A method of making a semiconductor device (10) includes filling a plurality of trenches (30, 32–34) in a substrate (11) with a first fill material (40, 42–44) and lined with a first liner material (36–39) to form an isolation structure (50) in a first trench (30). The first fill material and the first liner material are removed from a second trench (33) which is then lined with a second liner material (46) and filled with a second fill material (69) to produce a capacitance to the substrate. The first fill material and the first liner material are removed from a third trench (34), which is filled with the second fill material to form an electrical contact to the substrate. The first fill material is removed from a fourth trench (34) and dielectric material (78) is deposited on the substrate to produce a void (83) in the fourth trench.

18 Claims, 6 Drawing Sheets

SEMICONDUCTOR DEVICE AND METHOD OF INTEGRATING TRENCH STRUCTURES

BACKGROUND OF THE INVENTION

The present invention relates in general to semiconductor devices and, more particularly, to integrated circuits having trench structures formed in a semiconductor substrate.

Integrated circuits currently are implementing various of their component devices as trench structures in order to reduce the die area and cost as well as improve the performance of the integrated circuits. For example, isolation structures for electrically isolating integrated circuit components are formed with trenches to reduce the overall size of a semiconductor die. Other structures, such as substrate contacts, capacitors and low permittivity dielectric regions, may utilize trenches to achieve similar benefits of a reduced die area and fabrication cost and/or improved performance.

Trench structures have a problem in that a number of unique processing steps are needed to form each different type of component device. Previous integrated circuits limit the number of different types of component devices that are formed with trench structures in order to limit the total number of processing steps and maintain a low fabrication cost. As a result, the previous integrated circuits have a larger die size and/or lower performance.

Hence, there is a need for an integrated circuit and method of making multiple types of trench structures on a single semiconductor die that has a lower cost while maintaining a high performance of the integrated circuit.

DETAILED DESCRIPTION OF THE DRAWINGS

In the figures, elements having the same reference number have similar functionality.

Figure 1:
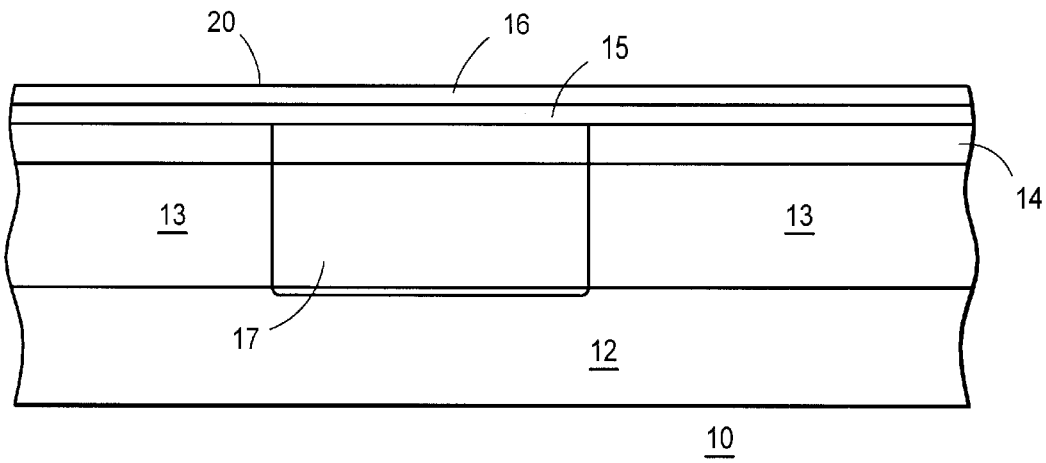
FIG. 1 is a cross-sectional view of an integrated circuit after a first fabrication stage.

FIG. 1 is a cross-sectional view of an integrated circuit 10 formed on a semiconductor substrate 11 after a first stage of fabrication. Integrated circuit 10 includes a base layer 12, a first epitaxial layer 13, a second epitaxial layer 14, a first dielectric layer 15 and a second dielectric layer 16.

Base layer 12 is formed to have a thickness of about two hundred fifty micrometers. In one embodiment, base layer 14 is heavily doped to have a p-type conductivity and a resistivity of about 0.01 ohm-centimeters to function as a ground plane for integrated circuit 10. In one embodiment, base layer 14 comprises monocrystalline silicon.

Epitaxial layer 13 is grown to a thickness of about 1.5 micrometers over base layer 14. In one embodiment, epitaxial layer 13 comprises monocrystalline silicon doped to have an n-type conductivity and a resistivity of about twenty ohm-centimeters.

Epitaxial layer 14 is grown to a thickness of about 1.5 micrometers over epitaxial layer 13. In one embodiment, epitaxial layer 14 comprises monocrystalline silicon doped to have a p-type conductivity and a resistivity of about ten ohm-centimeters.

Dielectric layer 15 is formed over epitaxial layer 14 to a thickness of about seven hundred angstroms. In one embodiment, dielectric layer 15 is formed with a thermally grown silicon dioxide.

A contact layer 17 is formed by heavily doping a selected portion of substrate 11 with p-type dopants and diffusing the dopants through epitaxial layers 13–14 and into a portion of base layer 12 as shown. In one embodiment, contact layer 17 has an effective average doping concentration of about $5.0*10^{19}$ atoms/centimeter$^3$ to provide a low resistance path for contacting base layer 12 of substrate 11.

Dielectric layer 16 is formed over dielectric layer 15 to a thickness of about one thousand five hundred angstroms. In one embodiment, dielectric layer 19 comprises a deposited silicon nitride.

Figure 2:
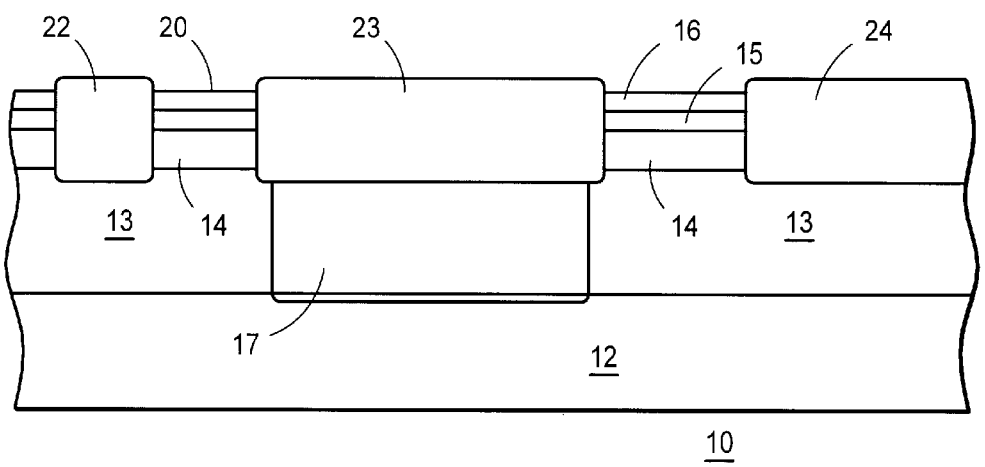
FIG. 2 is a top view of the integrated circuit after the second fabrication stage.

FIG. 2 shows a cross-sectional view of integrated circuit 10 after a second fabrication stage. A surface 20 of substrate 11 is patterned with photoresist to mask a series of standard etch steps that remove exposed portions of dielectric layers 15 and 16. Substrate 11 is then subjected to a thermal oxidation cycle to produce a plurality of field oxide regions 22–24 that extend through epitaxial layer 14 and into epitaxial layer 13 and contact layer 17 as shown.

Figure 3:
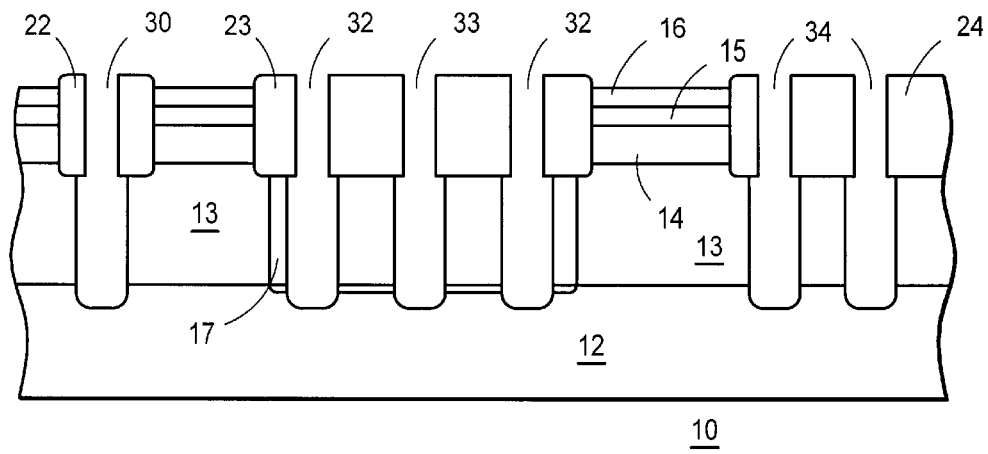
FIG. 3 is a cross-sectional view of the integrated circuit after a third fabrication stage.

FIG. 3 is a cross-sectional view of integrated circuit 10 after a third fabrication stage.

Photoresist is deposited and patterned and an anisotropic etch is applied to remove material from field oxide regions 22–24 and epitaxial layer 13 to form trenches 30 and 32–34 that extend into base layer 12. The anisotropic etch leaves trenches 30 and 32–34 with substantially vertical sidewalls. In one embodiment, trenches 30 and 32–34 are formed to a depth of about ten micrometers and a width of about 1.5 micrometers. In one embodiment, adjacent trenches are spaced about 1.5 micrometers apart. An optional downstream plasma etch is applied to remove exposed silicon in order to widen or undercut portions of trenches 30 and 32–34 that lie below field oxide regions 22–24.

Figure 4:
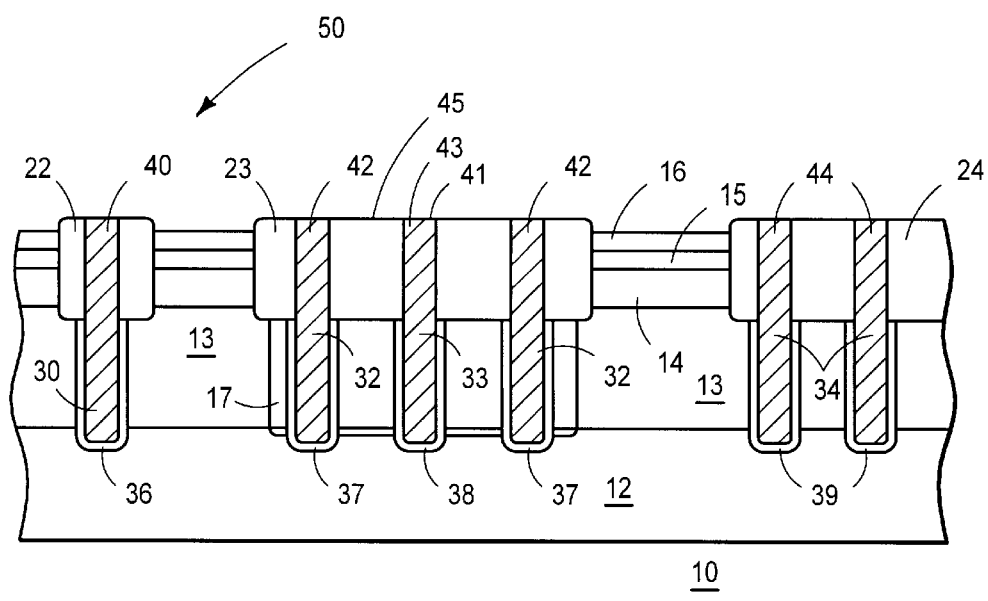
FIG. 4 is a cross-sectional view of the integrated circuit after a fourth fabrication stage.

FIG. 4 shows a cross-sectional view of integrated circuit 10 after a fourth fabrication stage. An insulating first liner material is formed on exposed silicon surfaces to produce a liner 36 along surfaces of trench 30, a liner 37 along surfaces of trenches 32, a liner 38 along surfaces of trench 33 and a liner 39 along surfaces of trenches 34. In one embodiment, liners 36–39 preferably comprise a thermally grown silicon dioxide formed to a thickness of about two thousand angstroms to provide a high quality interface to exposed monocrystalline silicon and also because a thermally grown oxide has low leakage characteristics.

A first fill material is deposited on integrated circuit 10 for filling trenches 30 and 32–34 to form plugs 40 and 42–44, respectively. The first fill material preferably comprises an insulating or low conductivity material with conformal fill properties in order to completely fill trenches 30 and 32–34. In one embodiment, the first fill material comprises undoped polycrystalline silicon which is deposited in an excess amount to ensure that trenches 30 and 32–34 are filled under a range of expected manufacturing conditions and/or tolerances. Excess portions of the first fill material are then etched back to form a substantially planar local surface so that, e.g., a top surface 41 of plug 43 is coplanar with a surface 45 of substrate 11. The dielectric properties of liner 36 and the first fill material are suitable for functioning as a trench isolation structure 50 to electrically isolate components of integrated circuit 10.

Figure 5:
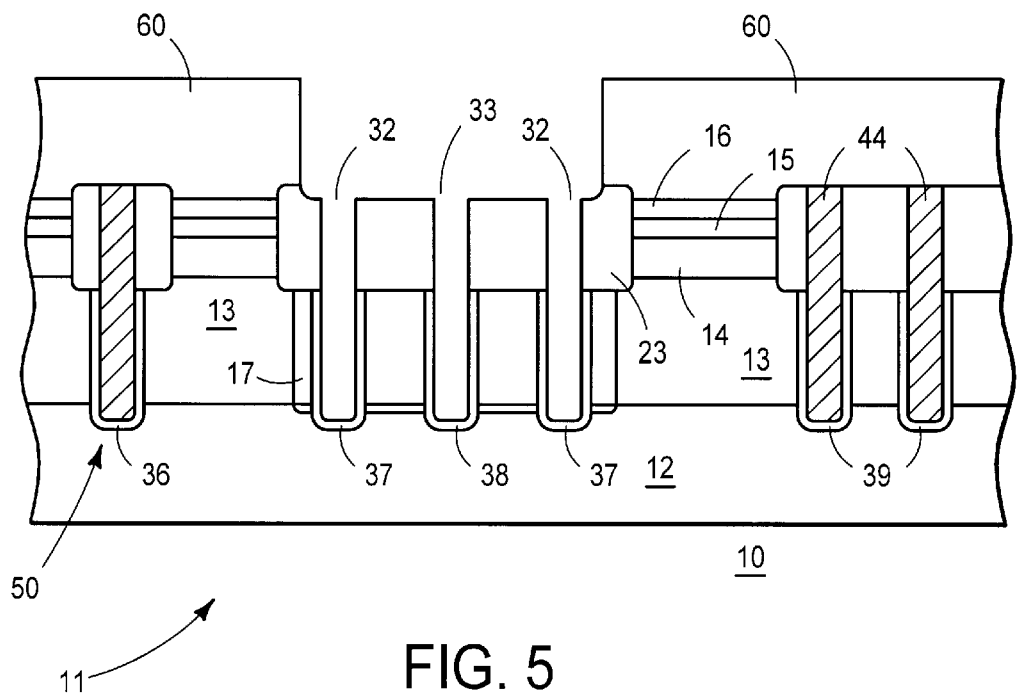
FIG. 5 is a top view of the integrated circuit after a fifth fabrication stage.

FIG. 5 shows a cross-sectional view of integrated circuit 10 after a fifth fabrication stage. A photoresist material is deposited and patterned to form a mask 60 that exposes trenches 32 and 33. A plasma etch process removes the first fill material from trenches 28 and 30.

Figure 6:
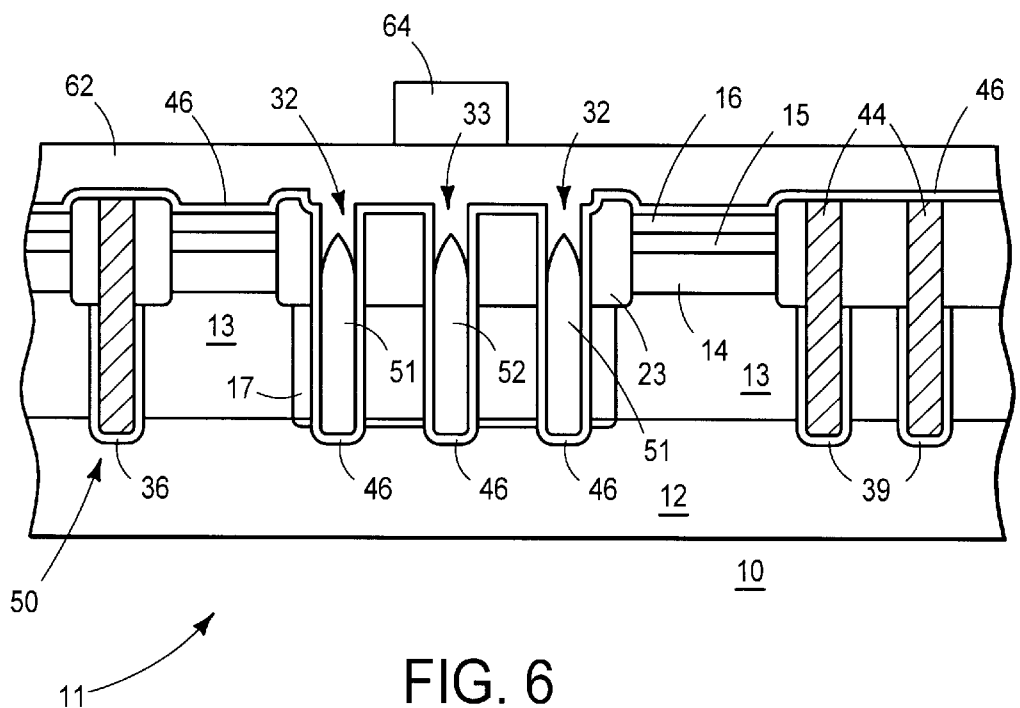
FIG. 6 is a cross-sectional view of the integrated circuit after a sixth fabrication stage.

FIG. 6 is a cross-sectional view of integrated circuit 10 after a sixth fabrication stage. Mask 60 is stripped and a wet etch is applied to remove liners 37–38 and small portions of field oxide regions 22–24.

A second dielectric liner material is deposited in an unpatterned or blanket fashion to a thickness of about seven hundred fifty angstroms to form a liner 46. In one embodiment, liner 46 comprises silicon nitride.

A dielectric material such as silicon dioxide is deposited to a thickness of about two micrometers over substrate 11 to form a dielectric layer 62. Portions of the dielectric material which are deposited near the openings of trenches 32–33 tend to accumulate and form a shadow that inhibits deposition at lower levels of trenches 32–33. This shadow effect is enhanced by the relatively narrow width of trenches 32–33. As a result, air gaps 51–52 are sealed within trenches 32–33, respectively, which facilitates the later removal of portions of dielectric layer 62.

A photoresist material is deposited and patterned to produce a mask 64 over trench 33.

Figure 7:
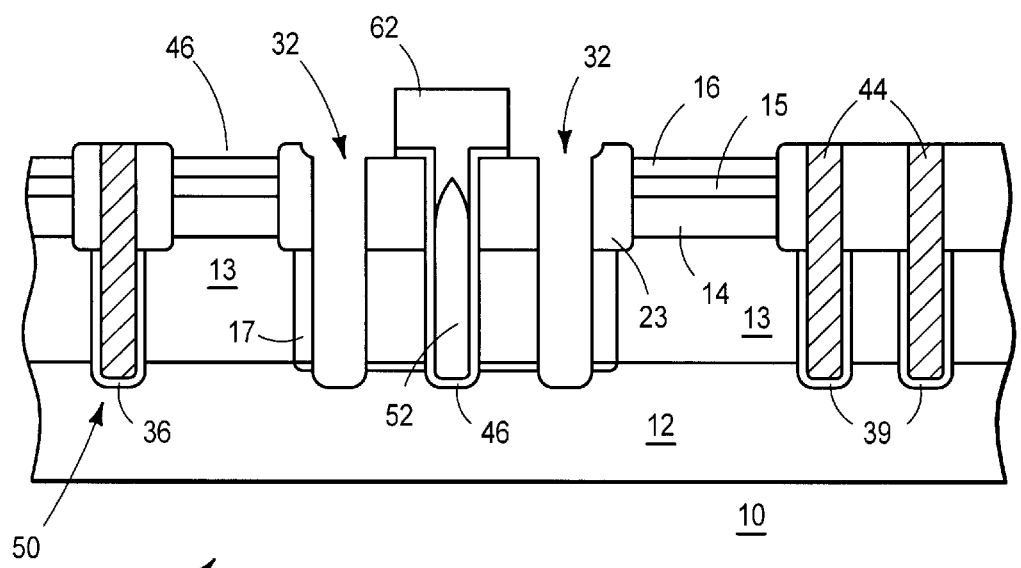
FIG. 7 is a cross-sectional view of the integrated circuit after a seventh fabrication stage.

FIG. 7 is a cross-sectional view of integrated circuit 10 after a seventh fabrication stage. A sequence of dry and wet etch steps remove portions of dielectric layer 62 that are not covered by mask 64 to produce a hard mask with unetched portions covered by mask 64. Trench 33 remains sealed.

Mask 64 is then removed and substrate 11 is etched to remove liner 46 in all regions except those covered by the unetched portion of dielectric layer 62. Note that in an embodiment where liner 46 and dielectric layer 16 are both formed from the same material, e.g., silicon nitride, this etch step may be a timed etch that removes liner 46 while leaving at least a portion of dielectric layer 16.

Another etch step then removes remaining portions of dielectric layer 62.

Figure 8:
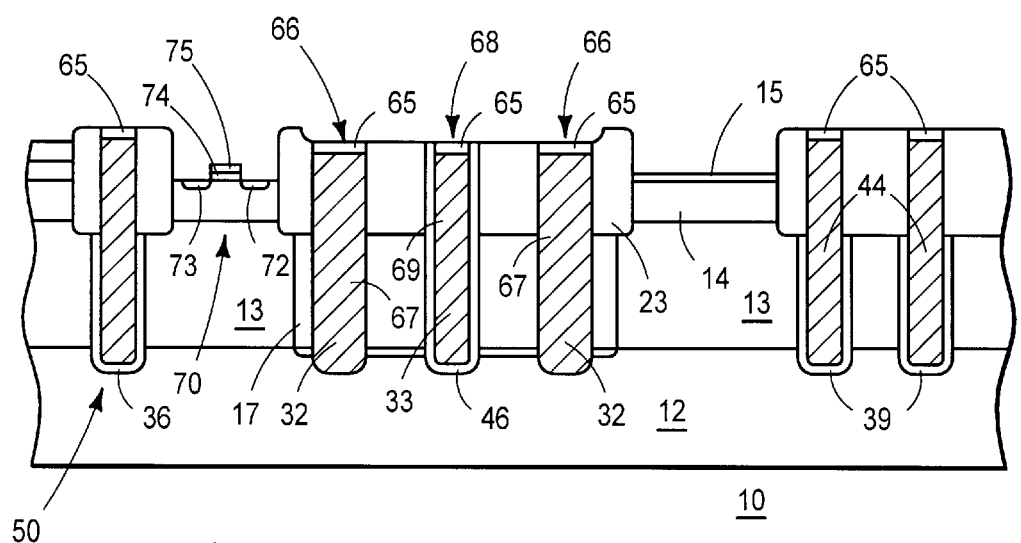
FIG. 8 is a cross-sectional view of the integrated circuit after a eighth fabrication stage.

FIG. 8 is a cross-sectional view of integrated circuit 10 after an eighth fabrication step. A second fill material is deposited and etched back to form plugs 67 and 69 that fill trenches 32–33, respectively. The second fill material comprises a conductive material such as doped polysilicon that forms an ohmic contact between plug 67 and contact layer 17 and/or base layer 12. In one embodiment, plugs 67 are formed with heavily doped polysilicon having a type conductivity to provide a low resistance substrate contact structure 66 in trenches 32. The low resistance allows plug 69 to function as a first electrode of a capacitor structure 68 that provides a capacitance between plug 69 and contact layer 17. Hence, contact layer 17 functions as a second electrode of capacitor structure 68 which typically is contacted via plug 67.

A wet etch step removes exposed portions of liner 46 and a second etch is used to remove dielectric layer 15.

A thin silicon dioxide layer is thermally grown over exposed silicon surfaces and patterned to form a gate oxide 74 and dielectric layers 65. N-type dopants are introduced into epitaxial layer 14 to produce a source electrode 72 and a drain electrode 74 of a transistor 70. A conductive material such as polysilicon is formed over gate oxide 74 to produce a gate electrode 75 of transistor 70.

Figure 9:
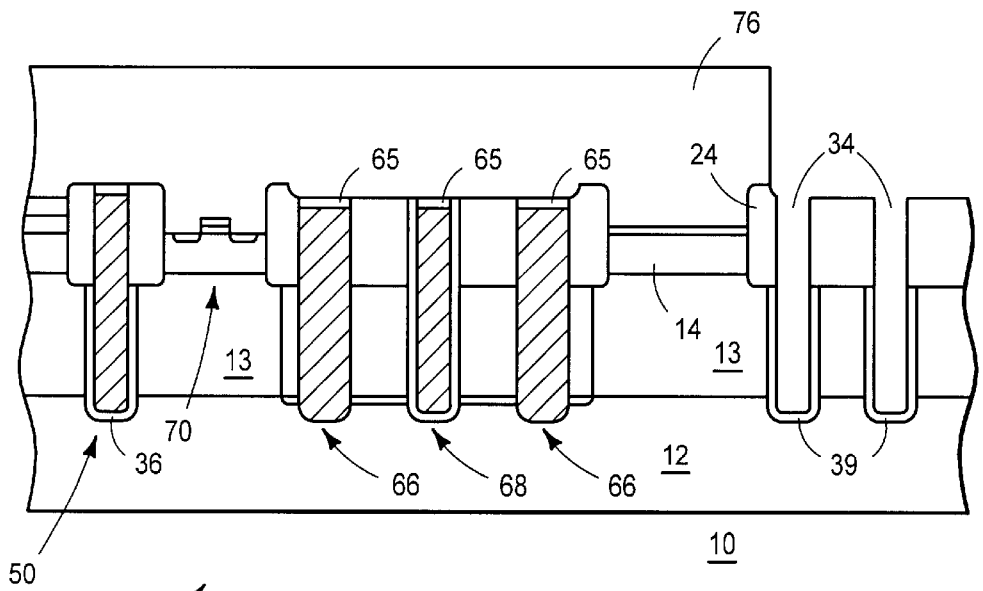
FIG. 9 is a cross-sectional view of the integrated circuit after a ninth fabrication stage.

FIG. 9 is a cross-sectional view of integrated circuit 10 after a ninth fabrication stage.

Photoresist material is deposited and patterned to form a mask 76 that exposes portions of field oxide region 24 and trenches 34. A dry etch step removes exposed portions of dielectric layer 65 in trenches 34. Another dry etch step removes plugs 44 to reopen trenches 34.

Figure 10:
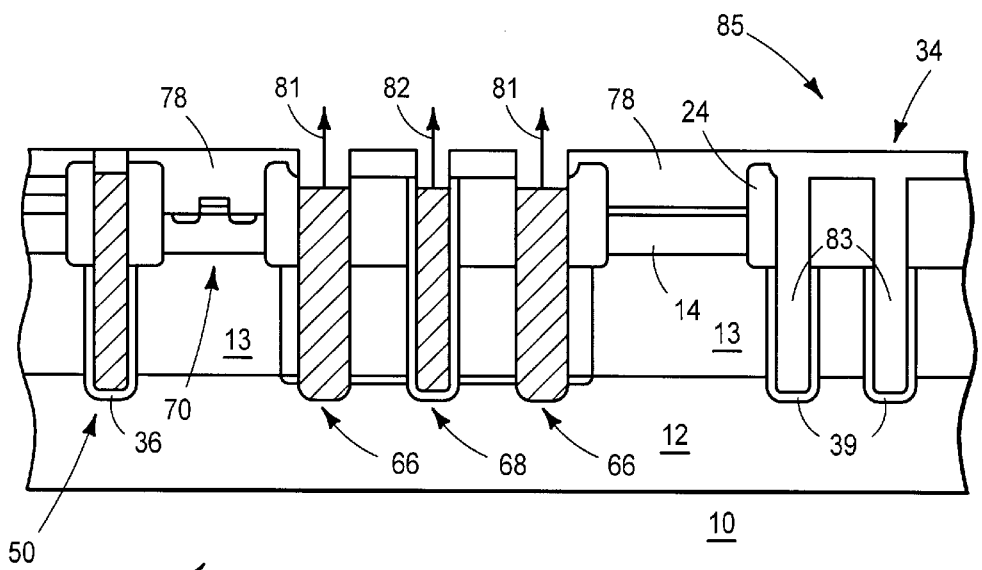
FIG. 10 is a cross-sectional view of the integrated circuit after a tenth fabrication stage.

FIG. 10 is a cross-sectional view of integrated circuit 10 after a tenth fabrication stage.

Mask 76 is removed and a high-pressure sputter etch is applied to form a dielectric layer 78 that functions as an interlayer dielectric. In one embodiment, dielectric layer 78 is formed with a deposited silicon dioxide having a thickness of about 1.0 micrometers. The sputter etch is performed at high pressure to redistribute etched material, which enhances the tendency of silicon dioxide to deposit at the openings of trenches 34 and to form sealed voids or air gaps 83. Dielectric layer 78 is then planarized using a chemical-mechanical polishing or similar step.

The gaseous material in air gaps 83 has a dielectric constant substantially equal to one, while adjacent regions have higher dielectric constants. For example, liner 39, which is formed with silicon dioxide, has a dielectric constant of about 3.9, and epitaxial layers 12–13, which comprise monocrystalline silicon, have a dielectric constant of about twelve. Because of the low permittivity of air gaps 83, the region that includes trenches 34 and adjacent portions of field oxide region 24 and epitaxial layers 12–13 is referred to as a low permittivity structure 85. In one embodiment, the overall effective permittivity of region 85 is about 2.5. The low permittivity reduces the parasitic capacitance of a component formed on low permittivity structure 85, which improves the performance of integrated circuit 10.

Note that while transistor 70 is being formed, trenches 34 remain filled with plugs 44, which maintains the mechanical strength of semiconductor substrate 11 and avoids a problem of gaseous material in air gaps 83 leaking out during critical processing steps to contaminate sensitive portions of integrated circuit 10. Since voids or air gaps 83 are formed after critical processing steps used to form active devices, the die yield is increased and the manufacturing cost of integrated circuit 10 is reduced.

Dielectric layer 78 is then patterned and etched to produce openings for contacting components of integrated circuit 10. For example, one opening provides access for an electrode 81 to bias substrate contact structure 66, and another opening provides access for an electrode 82 to contact capacitor structure 68. Other openings (not shown) provide access to other components of integrated circuit 10.

Figure 11:
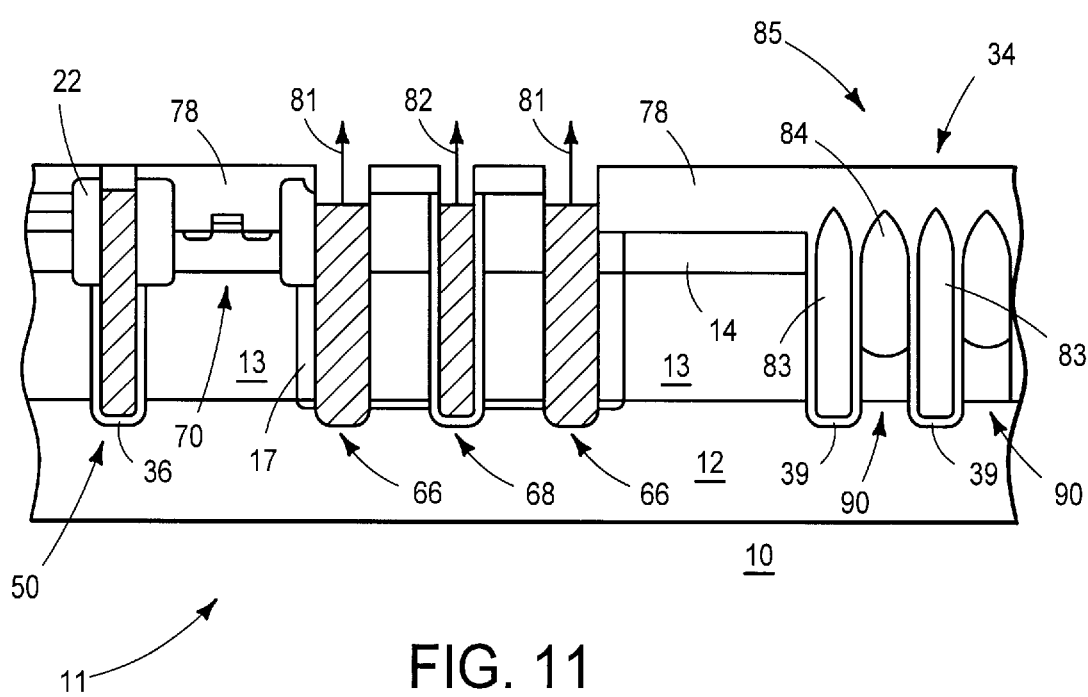
FIG. 11 shows the integrated circuit in an alternate embodiment.

FIG. 11 shows a cross-sectional view of integrated circuit 10 in an alternate embodiment. Processing is similar to that described above except that some or all of the field oxide regions are omitted. In the illustrated embodiment, field oxide region 22 is formed in isolation structure 50. However, there is no field oxide region in substrate contact structure 66, capacitor structure 68 or low permittivity structure 85.

Omitting a field oxide region in substrate contact structure 66 increases the area where plug 67 lies adjacent to contact area 17 and base layer 12. The increased area reduces the effective resistance of substrate contact structure 66, which reduces the chance of a latchup condition by maintaining base layer 12 at a more constant potential. Similarly, omitting a field oxide region from capacitor structure 68 increases the effective plate area of capacitor structure 68 and therefore its capacitance.

Omitting a field oxide region from low permittivity structure 85 allows semiconductor material from regions 90, which lie between trenches 34, to be removed when plugs 44 are etched to reopen trenches 34. In an embodiment where regions 90 comprise monocrystalline silicon and plugs 44 comprise polycrystalline silicon, the same etch process removes both materials. However, the etchant removes little or no material from liners 39, which therefore remain intact to provide structural support for dielectric layer 78. This processing scheme effectively produces voids or air gaps 84 between trenches 34 as well as within them. However, since standard silicon etchants remove polycrystalline material at a faster rate than monocrystalline material, air gaps 84 are not as deep as air gaps 83. Nevertheless, this fabrication method provides a further reduction in the effective permittivity of low permittivity structure 85, which further reduces the parasitic capacitances of components formed on low permittivity structure 85 and improves the performance of integrated circuit 10.

In summary, the present invention provides a method of forming an integrated circuit that includes a variety of trench structures for implementing different functions of the integrated circuit. Trenches are formed in a semiconductor substrate and lined with a first liner material. The trenches are then filled with a first fill material, which forms an isolation structure in a first trench. The first fill material is removed from a second trench and a second liner material is formed along surfaces of the second trench. A second fill material is deposited in the second trench to provide a capacitance between the second fill material and the semiconductor substrate. By initially filling the second trench with the first fill material which is subsequently replaced with the second fill material, the number of processing steps needed to form other trench structures is reduced. Hence, an efficient, low cost integration scheme for multiple types of trench structures is provided.

For example, the first fill and liner materials can be removed from a third trench, which is then filled with the second fill material to form a substrate contact structure which provides an electrical connection to the semiconductor substrate. After transistors or other components are formed, the first fill material is removed from a fourth trench and a dielectric material is deposited on the semiconductor substrate to produce a void or air gap in the fourth trench to reduce the permittivity of a region adjacent to the fourth trench. Since the fourth trench remains filled with the first fill material while the active devices are being formed, the low permittivity region remains mechanically stable during sensitive or critical processing steps, which improves the reliability and yield of the integrated circuit. Moreover, there is no gas that can leak out of the air gaps to contaminate active devices while they are being processed.

What is claimed is:

1. A method of making a semiconductor device, comprising the steps of:

filling trenches (30, 32–34) in a semiconductor substrate (11) with a first fill material (40, 42–44), where the trenches are lined with a first liner material (36–39) to form an isolation structure (50) in a first trench (30) of the trenches;

removing the first fill material and the first liner material from a second trench (33) of the trenches for lining the second trench with a second liner material (46);

filling the second trench with a second fill material (69) to produce a capacitance between the second fill material and the semiconductor substrate;

forming a transistor in the semiconductor substrate;

removing the first fill material from a fourth trench of the trenches; and depositing a dielectric material on the semiconductor substrate to produce a void in the fourth trench.

2. The method of claim 1, wherein the step of removing includes the step of removing the first fill material and the first liner material from a third trench of the trenches, further comprising the step of filling the third trench with the second fill material to form an electrical contact to the semiconductor substrate.

3. The method of claim 1, wherein the step of depositing includes the step of depositing silicon dioxide on the semiconductor substrate.

4. The method of claim 1, wherein the step of removing the first fill material from the fourth trench includes the step of removing undoped polysilicon from the fourth trench after the step of forming a transistor.

5. The method of claim 1, further comprising the step of lining the trenches with the first liner material.

6. The method of claim 5, wherein the step of lining includes the step of growing silicon dioxide along surfaces of the trenches.

7. The method of claim 1, wherein the step of filling includes the step of filling the trenches with undoped polycrystalline silicon.

8. The method of claim 1, wherein the step of removing includes the step of depositing silicon nitride to coat surfaces of the second trench.

9. The method of claim 1, wherein the step of filling includes the step of depositing doped polycrystalline silicon in the second trench to form an electrode of a capacitor.

10. A method of manufacturing an integrated circuit, comprising the steps of:

lining trenches in a substrate with a first dielectric material;

filling the trenches with a first semiconductor material;

removing the first semiconductor material from first and second trenches to provide an electrical path to the substrate with the first trench; and depositing a second dielectric material on the substrate for sealing an air gap within the second trench that reduces an effective permittivity of the integrated circuit.

11. The method of claim 10, further comprising the steps of:

etching the first dielectric material from the first trench; and depositing a second semiconductor material in the first trench to contact the electrical path.

12. The method of claim 11, wherein the step of filling includes the step of filling the trenches with an undoped polycrystalline semiconductor material, and the step of depositing the second semiconductor material includes the step of depositing a doped polycrystalline semiconductor material in the first trench.

13. The method of claim 12, wherein the step of filling the trenches with an undoped polycrystalline semiconductor material includes the step of filling the trenches with polysilicon.

14. The method of claim 12, wherein the step of depositing further includes the step of depositing polysilicon in the first trench.

15. The method of claim 10, further comprising the steps of:
- removing the first semiconductor material from a third trench of the trenches;
- lining the third trench with a third dielectric material; and
- filling the third trench with a second semiconductor material.

16. A method of making a semiconductor device, comprising the steps of:
- filling first and second trenches in a semiconductor substrate with a first fill material;
- etching the first trench to remove the first fill material;
- lining the first trench with a second dielectric material to develop a capacitance;
- then forming a transistor in the semiconductor substrate; and
- then removing the first fill material to form a void in the second trench.

17. The method of claim 16, further comprising the step of depositing a third dielectric material on the semiconductor substrate to seal the void.

18. The method of claim 17, wherein the first fill material and third dielectric materials include silicon dioxide and the second dielectric material includes silicon nitride.

* * * * *